United States Patent [19]

Takahashi

[11] Patent Number: 5,475,254
[45] Date of Patent: Dec. 12, 1995

[54] SEMICONDUCTOR DEVICE WITH THIN FILM RESISTOR

[75] Inventor: Kiyoshi Takahashi, Tokyo, Japan

[73] Assignee: NEC Corporation, Tokyo, Japan

[21] Appl. No.: 323,107

[22] Filed: Oct. 14, 1994

[30] Foreign Application Priority Data

Oct. 14, 1993 [JP] Japan .................................. 5-280537

[51] Int. Cl.⁶ ............................. H01L 23/02; H01L 27/02
[52] U.S. Cl. ......................... 257/536; 257/540; 257/537
[58] Field of Search ............................... 257/536, 537, 257/508, 540, 350, 379, 380, 381, 276; 338/22 SD, 64, 51

[56] References Cited

U.S. PATENT DOCUMENTS

| | | | |
|---|---|---|---|
| 3,862,017 | 1/1975 | Tsunemitsu et al. | 257/537 |
| 4,091,408 | 5/1978 | Lee et al. | 257/276 |

FOREIGN PATENT DOCUMENTS

| | | | |
|---|---|---|---|
| 62-84545 | 4/1987 | Japan | 257/536 |

OTHER PUBLICATIONS

"A High–Power GaAs FET Having Buried Plated Heat Sink for High–Performance MMIC's" vol. 41 No. 1 Jan. 1994, Ishikawa et al.

*Primary Examiner*—Sara W. Crane
*Assistant Examiner*—Jhihan Clark
*Attorney, Agent, or Firm*—Sughrue, Mion, Zinn, Macpeak & Seas

[57] ABSTRACT

On a semiconductor substrate, a thin film resistor and a metal wiring for electrically extracting the thin film resistor are formed via a firth interlayer insulator. A second interlayer insulator covering the thin film resistor and the metal wiring is formed on the first insulation layer. By removing the portion of the second interlayer insulator above the thin film resistor by etching, the insulator above the thin film resistor is provided thinner thickness. A heat radiating metal layer is formed on the second interlayer insulator having the thinner thickness.

6 Claims, 2 Drawing Sheets

FIG. I
(PRIOR ART)
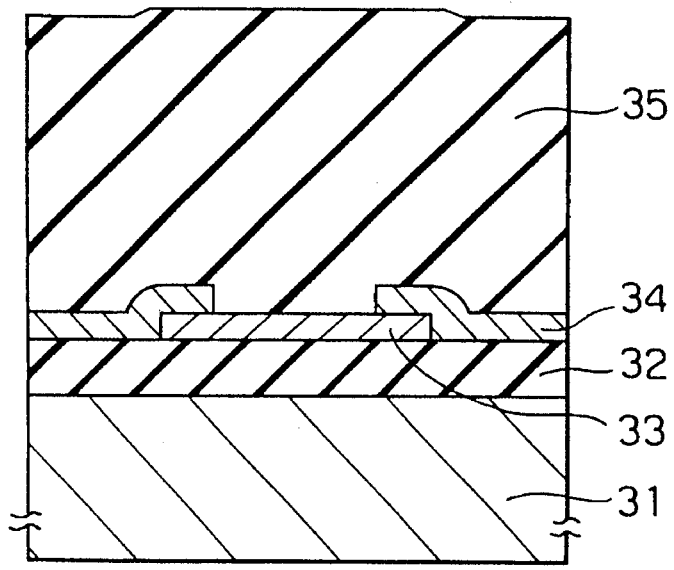
FIG. 3
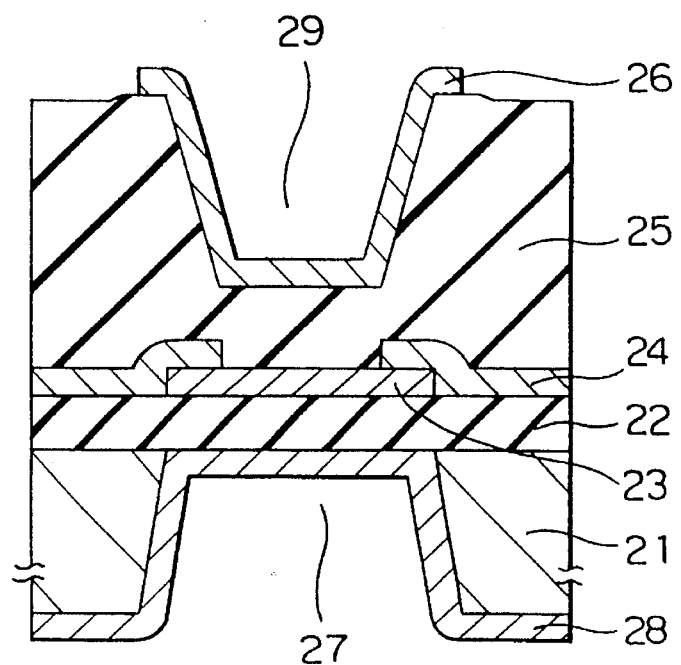

SEMICONDUCTOR DEVICE WITH THIN FILM RESISTOR

BACKGROUND OF THE INVENTION

1. Field of the Invention

The present invention relates generally to a semiconductor device. More specifically, the invention relates to a semiconductor device having a thin film resistor.

2. Description of the Related Art

A passive element for load resistance and bias resistance is formed in addition to an active element, such as a transistor and so forth in a certain type of semiconductor devices. As a resistor to be employed in such semiconductor device, a diffused resistor, a polycrystalline silicon resistor and a metal thin film resistor and so forth are known. Among these, thin film resistor is often employed in applications requiring high reliability, for capability of forming in high precision, lesser secular variation and other excellent properties.

FIG. 1 is a section of the conventional semiconductor device having a thin film resistor. As shown, on the semiconductor substrate 31 formed with predetermined elements, a first interlayer insulation layer 32 of a silicon oxide later or so forth is formed. On the first interlayer insulation layer 32, a thin film resistor 33 of a tungsten silicide (WSi) and so forth and a metal wiring 34 extending the thin film resistor 33 are formed. Furthermore, on the thin film resistor 33 and the metal wiring 34, a second interlayer insulation layer 35 of a silicon oxide layer and so forth is formed.

In the conventional semiconductor device as set forth above, the thin film resistor 33 is entirely enclosed by the interlayer insulation layers 32 and 35. The interlayer insulation layer is required to have a thickness greater than or equal to a given thickness in order to achieve interlayer insulation and to reduce parasitic capacity. Therefore, the insulation layer formed with the silicon oxide layer or so forth have quite low thermal conductivity. For instance, the thermal conductivity of the insulation layer is several digit lesser than that of the metal. Therefore, the thin film resistor has a large thermal resistance to significantly elevate the temperature of the resistor body. This results in variation of the resistance value, peeling off of the insulation layer and variation of characteristics of the active element (e.g. lowering of gm of the transistor) and so forth. Also, elevated temperature of the resistor body may accelerate fatigue of the resistor element in a long period of use.

SUMMARY OF THE INVENTION

It is an object of the present invention to improve heat radiation capability of the thin film resistor and whereby suppress elevation of temperature of a semiconductor device including the resistor and prevent variation of characteristics and fatigue.

A semiconductor device with a thin film resistor according to the present invention, comprises: a semiconductor substrate; a first interlayer insulator formed on said semiconductor substrate; a thin film resistor formed of a metal or metal compound on said first interlayer insulation layer and a metal wiring connected to said thin film resistor; a second interlayer insulator covering said thin film resistor and said metal wiring, said second interlayer insulator having thinner layer thickness at the portion located above said thin film resistor than other portion; and a heat radiating metal layer formed on said portion of said second interlayer insulator having thinner thickness.

According to the present invention, a semiconductor device having a thin film resistor has an interlayer insulation layer at upper layer of a thin film resistor, being provided a thinner layer thickness, and a metal plate for radiation on the thin portion of the interlayer insulation layer. With this construction, a thermal resistance of the thin film resistor can be reduced to suppress elevating of the temperature thereof. Accordingly, the present invention can prevent variation of a resistance value and degradation of characteristics of an active element. Also, the present invention can suppress breakage of the insulation layer and degradation of characteristics. In the alternative, it is possible to form a back side opening by removing a back side portion of the semiconductor substrate immediately below the thin film resistor for achieving the similar effect.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for ex ion and understanding only.

In the drawings:

FIG. 1 is a section showing a semiconductor device having a thin film resistor;

FIG. 3 is a section showing the second embodiment of a semiconductor device with a thin film resistor.

DETAILED DESCRIPTION OF THE PREFERRED EMBODIMENTS

Figure 2:
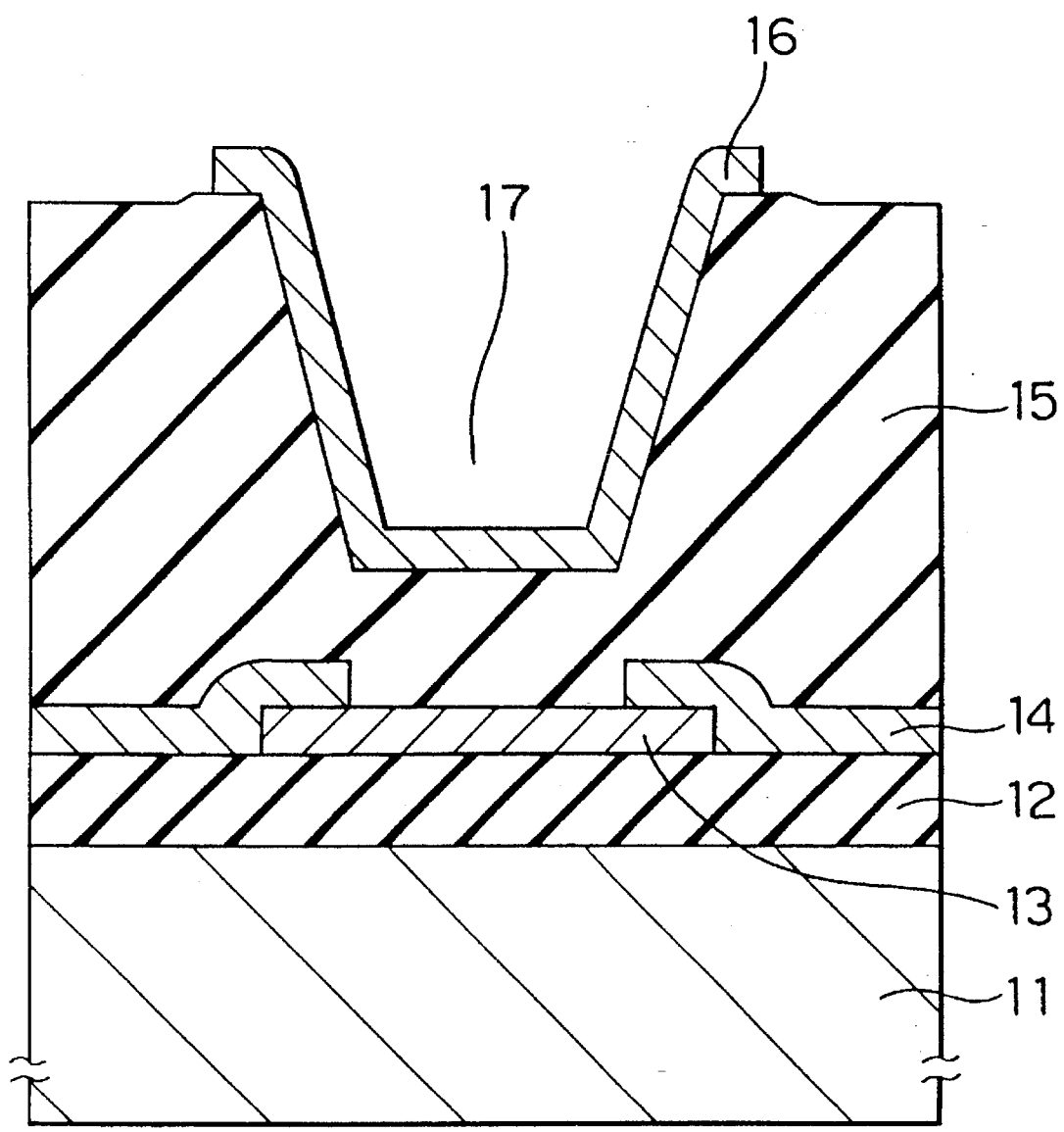
FIG. 2 is a section showing the first embodiment of a semiconductor device with a thin film resistor.

The preferred embodiments of semiconductor devices according to the present invention will be discussed hereinafter in detail with reference to the accompanying drawings, particularly FIGS. 2 and 3. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

FIG. 2 is a section showing the first embodiment of a semiconductor device with a thin film resistor according to the present invention. In FIG. 2, on a semiconductor substrate 11 formed of GaAs, MESFET (not shown) is formed. On this substrate 11, a first interlayer insulation layer 12 is formed with silicon oxide layer in a layer thickness of 1.5 µm, for example, by way of chemical vapor deposition (CVD). On the first interlayer insulation layer 12, tungsten silicide is deposited by way of spattering in a layer thickness of 1000 Å. The tungsten silicide layer is patterned into a rectangular shaped configuration in a size of 100 µm×50 µm by photolithographic technology to form a thin film resistor 13 serving as load resistor for the MESFET.

Also, on the first interlayer insulation layer 12 and the thin film resistor 13, a metal wiring 14 is formed by depositing aluminum by spattering and patterning the aluminum layer. Then, covering the thin resistor 13 and the metal wiring 14, a second interlayer insulation layer 15 in a layer thickness of 0.1 µm, for example is formed by depositing silicon oxide layer by the CVD method in a thickness to have substantially flat surface and subsequently effecting etching back.

Subsequently, employing a mask used for patterning the thin film resistor 13, a photoresist layer is formed. Then, dry etching is performed to reduce the layer thickness of the second insulation layer 15 at the position immediately above the thin film resistor 13 to have a layer thickness of 500 Å, for example, to form a recess 17 in the second interlayer insulation layer. At this time, control of the layer thickness in the dry etching is achieved by performing etching for a period derived from an etching rate. Thereafter, aluminum deposited in a layer thickness of 2000 Å by way of spattering. For the aluminum layer thus formed, patterning is performed by dry etching to leave the portion above the thin film resistor 13. By this, a metal layer 16 for heat radiation is formed above the thin film resistor 13. In conjunction with formation of the metal layer 16 for heat radiation, upper wiring layer may be formed as required.

In the semiconductor device with the thin film resistor constructed as set forth above, since the second interlayer insulation layer 15 is formed thinner at the portion between the thin film resistor 13 and the heat radiating metal film 16 by forming the recess 17, heat generated by the thin film resistor 13 can be effectively transmitted to the heat radiating metal layer 16 and radiated to the atmosphere through the heat radiating metal layer 16.

Through heat transmission analyzing simulation with respect to the shown embodiment, it has been found that 40% of heat resistance can be reduced. By reduction of the heat resistance, variation magnitude of the resistance value of the thin film resistor 13 can be reduced in the extent of 5 to 10%.

FIG. 3 is a section showing the second embodiment of the semiconductor device with the thin film resistor according to the present invention. A semiconductor substrate 21 formed of GaAs, MESFET (not shown) is formed. On this substrate 21, a first interlayer insulation layer 22 is formed with silicon oxide layer in a layer thickness of 0.5 μm, for example. On the first interlayer insulation layer 22, titanium nitride (TIN) is deposited by way of spattering in a layer thickness of 1500 Å. The titanium nitride layer is patterned into a rectangular shaped configuration in a size of 100 μm×100 μm by photolithographic technology to form a thin film resistor 23 serving as load resistor for the MESFET.

Also, a metal wiring 24 is formed by depositing aluminum in a layer thickness of 1500 Å by spattering and patterning of the aluminum layer. Then, covering the thin resistor 23 and the metal wiring 24, a second interlayer insulation layer 25 in a layer thickness of 1.0 μm, for example is formed by depositing silicon nitride ($Si_3N_4$) layer by the CVD method in a thickness to have substantially flat surface and subsequently effecting etching back.

Subsequently, similarly to the foregoing first embodiment, dry etching is performed to reduce the layer thickness of the second insulation layer 25 at the position immediately above the thin film resistor 23 to have a layer thickness of 500 Å, for example, to form a recess 29 in the second interlayer insulation layer. Thereafter, aluminum deposited in a layer thickness of 2000 Å to form a metal layer 26 for heat radiation.

Subsequently, etching is performed for the entire surface of the back side of the semiconductor substrate 21 to reduce the thickness thereof to be 100 μm. Then, wet etching is effected for the back side of the semiconductor substrate at the position immediately below the thin film resistor 23 to expose the back side of the first interlayer insulation layer 22. By this process, a back side opening 27 for heat radiation is formed. Next, on the back sides of the first interlayer insulation layer 22 and the substrate 21, after forming an undercoating metal layer, electroplating is performed for forming a gold plated layer 28 which serves as a back side electrode as well as a heat radiating metal layer.

According to the shown embodiment, the heat generated by the thin film resistor 23 can be radiated not only through the heat radiating metal layer 26 but also through the gold plated layer 28. Therefore, lower heat resistance than that of the former embodiment can be achieved.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, while metal compounds, i.e. tungsten silicide and titanium nitride are employed as materials for forming the thin film resistor in the foregoing embodiments, other meal compounds or metals, such as Cr, NiCr and so forth can also be employed. Also, the metal wiring and the heat radiating metal layer may be formed of Cu, Au or so forth.

Furthermore, the present invention is applicable not only to the semiconductor device employing GaAs substrate but also to the semiconductor device employing Si substrate or substrate of other material.

What is claimed is:

1. A semiconductor device comprising:

a semiconductor substrate;

a first interlayer insulator formed on said semiconductor substrate;

a thin film resistor formed of a metal or metal compound on said first interlayer insulating layer;

a metal wiring connected to said thin film resistor;

a second interlayer insulator covering said thin film resistor and said metal wiring, said second interlayer insulator having a thickness which is thinnest at a portion located above said thin film resistor; and a heat radiating metal layer formed on said thinnest portion of said second interlayer insulator, and having a portion in contact with the atmosphere.

2. A semiconductor device as set forth in claim 1, wherein the entire portion of said semiconductor substrate which is located below said thin film resistor is removed from the back side for forming a back side opening, and a heat radiating metal layer is formed on the bottom of said back side opening.

3. A semiconductor device as set forth in claim 1, wherein said heat radiating metal layer formed on said second interlayer insulator is formed simultaneously with an upper layer wiring.

4. A semiconductor device as set forth in claim 1, wherein said heat radiating metal layer formed on the bottom of said back side opening also serves as a back side electrode.

5. A semiconductor device comprising:

a semiconductor substrate;

a first interlayer insulator formed on said semiconductor substrate;

a thin film resistor formed of a metal or metal compound on said first interlayer insulating layer;

a metal wiring connected to said thin film resistor;

wherein the entire portion of said semiconductor substrate which is located immediately below said thin film resistor is removed thus defining a back side opening;

a second interlayer insulator covering said thin film resistor and said metal wiring; and a heat radiating metal layer formed on the bottom of said back side opening.

6. A semiconductor device as set forth in claim 5, wherein said heat radiating metal layer formed on the bottom of said back side opening also serves as a back side electrode.

* * * * *

UNITED STATES PATENT AND TRADEMARK OFFICE
CERTIFICATE OF CORRECTION

PATENT NO.   : 5,475,254
DATED        : December 12, 1995
INVENTOR(S)  : Kiyoshi TAKAHASHI It is certified that error(s) appears in the above-identified patent and that said Letters Patent is hereby corrected as shown below:

Col. 2, line 23, delete "ex ion", insert --explanation--.

Signed and Sealed this

Eighteenth Day of June, 1996

Attest:

BRUCE LEHMAN

*Attesting Officer*            *Commissioner of Patents and Trademarks*